(12) United States Patent
Otake et al.

(10) Patent No.: US 12,225,738 B2
(45) Date of Patent: Feb. 11, 2025

(54) METHOD FOR MANUFACTURING NITRIDE SEMICONDUCTOR DEVICE AND NITRIDE SEMICONDUCTOR DEVICE

(71) Applicant: ROHM CO., LTD., Kyoto (JP)

(72) Inventors: Hirotaka Otake, Kyoto (JP); Kentaro Chikamatsu, Kyoto (JP)

(73) Assignee: ROHM CO., LTD., Kyoto (JP)

(*) Notice: Subject to any disclaimer, the term of this patent is extended or adjusted under 35 U.S.C. 154(b) by 341 days.

(21) Appl. No.: 17/787,945

(22) PCT Filed: Jan. 15, 2021

(86) PCT No.: PCT/JP2021/001163
§ 371 (c)(1),
(2) Date: Jun. 22, 2022

(87) PCT Pub. No.: WO2021/149599
PCT Pub. Date: Jul. 29, 2021

(65) Prior Publication Data
US 2023/0043312 A1    Feb. 9, 2023

(30) Foreign Application Priority Data
Jan. 24, 2020    (JP) .................. 2020-010249

(51) Int. Cl.
*H01L 29/778*    (2006.01)
*H01L 29/20*    (2006.01)
(Continued)

(52) U.S. Cl.
CPC ....... *H10D 30/4732* (2025.01); *H10D 30/015* (2025.01); *H10D 30/6738* (2025.01);
(Continued)

(58) Field of Classification Search
CPC .................................. H01L 29/7783
See application file for complete search history.

(56) References Cited

U.S. PATENT DOCUMENTS 5,663,091 A * 9/1997 Yen ................ H01L 23/5252
438/701
8,823,012 B2   9/2014 Lidow et al.
(Continued)

FOREIGN PATENT DOCUMENTS

CN    108447907 A    8/2018
CN    109727863 A    5/2019
(Continued)

OTHER PUBLICATIONS

Office Action issued on Mar. 6, 2023, in corresponding German patent Application No. 112021000415.8, 17 pages.
(Continued)

*Primary Examiner* — William A Harriston
(74) *Attorney, Agent, or Firm* — XSENSUS LLP (57) ABSTRACT

A method for manufacturing nitride semiconductor device includes a second step of forming, on a gate layer material film, a gate electrode film that is a material film of a gate electrode, a third step of selectively etching the gate electrode film to form the gate electrode 22 of a ridge shape, and a fourth step of selectively etching the gate layer material film to form a semiconductor gate layer 21 of a ridge shape with the gate electrode 22 disposed at a width intermediate portion of a front surface thereof. The third step includes a first etching step for forming a first portion 22A from an upper end to a thickness direction intermediate portion of the gate electrode 22 and a second etching step being a step differing in etching condition from the first etching step and being for forming a remaining second portion 22B of the gate electrode.

18 Claims, 9 Drawing Sheets

(51) Int. Cl.
  *H01L 29/205* (2006.01)
  *H01L 29/47* (2006.01)
  *H01L 29/66* (2006.01)

(52) U.S. Cl.
  CPC ......... *H10D 30/675* (2025.01); *H10D 62/824* (2025.01); *H10D 62/85* (2025.01); *H10D 62/8503* (2025.01); *H10D 64/64* (2025.01)

(56) References Cited

U.S. PATENT DOCUMENTS

| | | | | |
|---|---|---|---|---|
| 10,522,646 | B2* | 12/2019 | Iucolano | H01L 29/7787 |
| 2009/0146243 | A1* | 6/2009 | Lee | H01L 29/66621 |
| | | | | 257/E21.429 |
| 2012/0223319 | A1* | 9/2012 | Dora | H01L 29/872 |
| | | | | 257/E29.094 |
| 2013/0221434 | A1* | 8/2013 | Okada | H01L 29/7788 |
| | | | | 438/270 |
| 2014/0141595 | A1* | 5/2014 | Babic | H01L 21/02502 |
| | | | | 438/460 |
| 2014/0264369 | A1* | 9/2014 | Padmanabhan | H01L 27/0688 |
| | | | | 438/172 |
| 2017/0104091 | A1 | 4/2017 | Tanaka | |
| 2021/0376136 | A1* | 12/2021 | Akutsu | H01L 21/30621 |

FOREIGN PATENT DOCUMENTS

| | | |
|---|---|---|
| JP | H08-306707 A | 11/1996 |
| JP | 2015-073002 A | 4/2015 |
| JP | 2017-73506 A | 4/2017 |

OTHER PUBLICATIONS

International Search Report and Written Opinion mailed on Apr. 6, 2021, received for PCT Application PCT/JP2021/001163, filed on Jan. 15, 2021, 11 pages including English Translation.
Japanese Office Action issued Nov. 14, 2024 in corresponding Japanese Patent Application No. 2021-573120, 6 pages.

* cited by examiner

METHOD FOR MANUFACTURING NITRIDE SEMICONDUCTOR DEVICE AND NITRIDE SEMICONDUCTOR DEVICE

Cross-Reference to related application

The present application is based on PCT filing PCT/JP2021/001163, filed Jan. 15, 2021, which claims priority to JP 2020-010249, filed Jan. 24, 2020, the entire contents of each are incorporated herein by reference.

TECHNICAL FIELD

The present invention relates to a method for manufacturing a nitride semiconductor device that is constituted of a group III nitride semiconductor (hereinafter referred to at times simply as "nitride semiconductor") and to a nitride semiconductor device.

BACKGROUND ART

A group III nitride semiconductor is a semiconductor among group III-V semiconductors with which nitrogen is used as the group V element. Aluminum nitride (AlN), gallium nitride (GaN), and indium nitride (InN) are representative examples thereof. It can generally be expressed as $Al_xIn_yGa_{1-x-y}N$ ($0 \leq x \leq 1$, $0 \leq y \leq 1$, $0 \leq x+y \leq 1$).

An HEMT (high electron mobility transistor) using such a nitride semiconductor has been proposed. Such an HEMT includes, for example, an electron transit layer constituted of GaN and an electron supply layer constituted of AlGaN epitaxially grown on the electron transit layer. A pair of source electrode and drain electrode are formed such as to contact the electron supply layer and a gate electrode is disposed therebetween.

Due to polarization caused by lattice mismatch of GaN and AlGaN, a two-dimensional electron gas is formed at a position inside the electron transit layer that is only a few Å inward from an interface between the electron transit layer and the electron supply layer. A source and a drain are connected to each other with the two-dimensional electron gas as a channel. When the two-dimensional electron gas is interrupted by application of a control voltage to the gate electrode, the source and the drain are interrupted from each other. The source and the drain are made conductive to each other in a state where the control voltage is not applied to the gate electrode and therefore the device is of a normally-on type.

Devices using a nitride semiconductor have features of high withstand voltage, high temperature operation, high current density, high speed switching, and low on resistance and applications to power devices are thus being proposed, for example, in Patent Literature 1.

Patent Literature 1 discloses an arrangement where a p type GaN gate layer (nitride semiconductor gate layer) of a ridge shape is laminated on an AlGaN electron supply layer, a gate electrode is disposed thereon, and a channel is eliminated by a depletion layer spreading from the p type GaN gate layer to achieve a normally-off operation.

CITATION LIST

Patent Literature

Patent Literature 1: Japanese Patent Application Publication No. 2017-73506
Patent Literature 2: U.S. Pat. No. 8,823,012 specification

SUMMARY OF INVENTION

Technical Problem

One problem with an HEMT that uses a p type GaN gate layer is a leak current between a gate and a source. There are mainly two paths for the leak current.

The first is a path that passes via a p type GaN gate layer and an electron supply layer from directly below a gate electrode, reaches an electron transit layer, and leads to a source electrode via a two-dimensional electron gas. The leak current that flows via this path is influenced by a barrier height of the electron supply layer, a Schottky barrier height of an interface between the gate electrode and the p type GaN gate layer, and an electric field generated inside the p type GaN gate layer and the electron supply layer.

The second is a path that passes via front surfaces and side surfaces of the p type GaN gate layer and the electron supply layer from the gate electrode and leads to the source electrode. The leak current that flows via this path is influenced by front surface resistances and side surface resistances of the p type GaN gate layer and the electron supply layer.

As an art that reduces the leak current flowing via the second path, there is an arrangement where, by forming the gate electrode in a width intermediate portion of the front surface of the p type GaN gate layer, the leak current that flows to the source electrode via the front surface and the side surfaces of the p type GaN gate layer is reduced (see Patent Literature 2).

That is, with Patent Literature 2, regions in which the gate electrode is not formed are formed at portions at both sides of the front surface of the p type GaN gate layer to increase distances between lower edges of side surfaces of the gate electrode and upper edges of the corresponding side surfaces of the p type GaN gate layer to reduce the leak current flowing via the side surfaces of the p type GaN gate layer. In the following, each of the region at the portions at both sides of the front surface of the p type GaN gate layer at which the gate electrode is not formed is referred to at times as a ledge.

To manufacture the GaN device described in Patent Literature 2, a gate electrode film is formed on a front surface of a material layer (hereinafter referred to as the p type GaN layer) of the p type GaN gate layer and thereafter, the gate electrode film is etched selectively. If in this process, an etching damage applied to the front surface of the p type GaN gate layer is large, for example, the front surface of the p type GaN gate layer changes to an n type due to desorption of nitrogen therefrom. Therefore, even if ledges are present on the p type GaN gate layer, the front surface of the p type GaN gate layer cannot be made high in resistance and the gate leak current cannot be reduced.

Also, if the gate electrode is in Schottky contact with the p type GaN gate layer, electric field concentration occurs at edge portions at both sides of the gate electrode. This presents another problem that Schottky barriers at the edge portions at both sides are lowered easily in comparison to a width center portion of the gate electrode and a gate leak current due to this phenomenon may be generated.

An object of the present invention is to provide a method for manufacturing nitride semiconductor device and a nitride semiconductor device with which the gate leak current can be reduced.

Solution to Problem

A preferred embodiment of the present invention provides a method for manufacturing nitride semiconductor device including a first step of forming a first nitride semiconductor layer that constitutes an electron transit layer, a second nitride semiconductor layer that constitutes an electron supply layer, and a gate layer material film that is a material film of a nitride semiconductor gate layer containing an acceptor type impurity in that order above a substrate, a second step of forming, on the gate layer material film, a gate electrode film that is a material film of a gate electrode, a third step of selectively etching the gate electrode film to form the gate electrode of a ridge shape, a fourth step of selectively etching the gate layer material film to form the semiconductor gate layer of a ridge shape with the gate electrode disposed at a width intermediate portion of a front surface thereof, and a fifth step of forming a passivation film such as to cover an exposed front surface of the second nitride semiconductor layer, side surfaces and an exposed front surface of the nitride semiconductor gate layer, and side surfaces of the gate electrode, and where the third step includes a first etching step for forming a first portion from an upper end to a thickness direction intermediate portion of the gate electrode and a second etching step being a step differing in etching condition from the first etching step and being for forming a remaining second portion of the gate electrode and the exposed front surface of the second nitride semiconductor layer, the side surfaces and the exposed front surface of the nitride semiconductor gate layer, and the side surfaces of the gate electrode are covered by the same passivation film.

With the present arrangement, it is possible to perform etching of less etching damage in comparison to the first etching step in the second etching step. Etching damage applied to the front surface of the semiconductor gate layer can thereby be reduced in comparison to a case of forming the entire gate electrode by the first etching step. A gate leak current that flows from the gate electrode to a source electrode via the front surfaces and the side surfaces of the semiconductor gate layer and the second nitride semiconductor layer can thereby be reduced.

In the preferred embodiment of the present invention, a thickness of the gate electrode film removed by the first etching step is greater than a thickness of the gate electrode film removed by the second etching step.

In the preferred embodiment of the present invention, if inclination angles of both side surfaces of the first portion with respect to the front surface of the semiconductor gate layer when a width of the first portion becomes narrower as the second portion is approached are expressed by angles of not less than 90 degrees and inclination angles of both side surfaces of the first portion with respect to the front surface of the semiconductor gate layer when the width of the first portion becomes wider as the second portion is approached are expressed by angles of not more than 90 degrees, an average inclination angle of the respective side surfaces of the first portion with respect to the front surface of the semiconductor gate layer is within a range of not less than 80 degrees and not more than 95 degrees.

In the preferred embodiment of the present invention, an etching rate in a vertical direction per unit time of the second etching step is slower than an etching rate in the vertical direction per unit time of the first etching step.

In the preferred embodiment of the present invention, a lateral direction amount that is etched in the second etching step is greater than a lateral direction amount that is etched in the first etching step.

In the preferred embodiment of the present invention, the second etching step is dry etching.

In the preferred embodiment of the present invention, the second etching step is wet etching.

In the preferred embodiment of the present invention, the first etching step is dry etching.

In the preferred embodiment of the present invention, a step of forming a first insulating film on the gate layer material film such as to cover the gate electrode and thereafter etching back the first insulating film to form side walls that cover the side surfaces of the gate electrode is further included between the third step and the fourth step.

In the preferred embodiment of the present invention, a step of forming a second insulating film on a front surface of the gate electrode film and thereafter selectively etching the second insulating film to form a mask on the front surface of the gate electrode film is further included between the second step and the third step and in the third step, the gate electrode film is etched using the mask.

In the preferred embodiment of the present invention, a step of removing the side walls is further included between the fourth step and the fifth step.

In the preferred embodiment of the present invention, a step of removing the mask and the side walls is further included between the fourth step and the fifth step.

In the preferred embodiment of the present invention, a step of forming a barrier metal on the passivation film, a step of forming a source contact hole and a drain contact hole that penetrate through the barrier metal and the passivation film at positions opposing each other across the semiconductor gate layer, a step of forming, on the barrier metal, a source/drain electrode film that covers at least the source contact hole and the drain contact hole, and a step of selectively etching the source/drain electrode film and the barrier metal to form the source electrode and a drain electrode are further included after the fifth step.

A preferred embodiment of the present invention provides a nitride semiconductor device including a substrate, a first nitride semiconductor layer that is formed above the substrate and constitutes an electron transit layer, a second nitride semiconductor layer that is formed on the first nitride semiconductor layer, is greater in bandgap than the first nitride semiconductor layer, and constitutes an electron supply layer, a semiconductor gate layer of ridge shape that is formed on the second nitride semiconductor layer and contains an acceptor type impurity, a gate electrode of ridge shape that is formed on a width intermediate portion of a front surface of the semiconductor gate layer, a passivation film that is formed such as to cover an exposed surface of a front surface of the second nitride semiconductor layer and side surfaces and a front surface of the gate electrode, and a source electrode and a drain electrode that are disposed on the second nitride semiconductor layer to oppose each other across the semiconductor gate layer, and where the gate electrode, in a sectional view in a ridge width direction, is constituted of a first portion of rectangular shape and a second portion that projects downward from a width intermediate portion of a lower surface of the first portion, and the exposed surface of the front surface of the second nitride semiconductor layer and the side surfaces and the front surface of the gate electrode are covered by the same passivation film.

With the present arrangement, it is possible, when forming the second portion, to perform etching of less etching damage in comparison to when forming the first portion. Etching damage applied to the front surface of the semiconductor gate layer can thereby be reduced in comparison to a case of forming the entire gate electrode as a gate electrode constituted of just the first portion. A gate leak current that flows from the gate electrode to the source electrode via the front surfaces and the side surfaces of the semiconductor gate layer and the second nitride semiconductor layer can thereby be reduced.

In the preferred embodiment of the present invention, if inclination angles of both side surfaces of the first portion with respect to the front surface of the semiconductor gate layer when a width of the first portion becomes narrower as the second portion is approached are expressed by angles of not less than 90 degrees and inclination angles of both side surfaces of the first portion with respect to the front surface of the semiconductor gate layer when the width of the first portion becomes wider as the second portion is approached are expressed by angles of not more than 90 degrees, an average inclination angle of the respective side surfaces of the first portion with respect to the front surface of the semiconductor gate layer is within a range of not less than 80 degrees and not more than 95 degrees.

In the preferred embodiment of the present invention, the first nitride semiconductor layer is constituted of a GaN layer, the second nitride semiconductor layer is constituted of an $Al_xGa_{1-x}N$ ($0<x\leq1$) layer, and the third nitride semiconductor gate layer is constituted of a p type GaN layer.

In the preferred embodiment of the present invention, the acceptor impurity is Mg or Zn.

In the preferred embodiment of the present invention, the gate electrode is in Schottky contact with the semiconductor gate layer.

The aforementioned as well as yet other objects, features, and effects of the present invention will be made clear by the following description of the preferred embodiments made with reference to the accompanying drawings.

DESCRIPTION OF EMBODIMENTS

Figure 1:
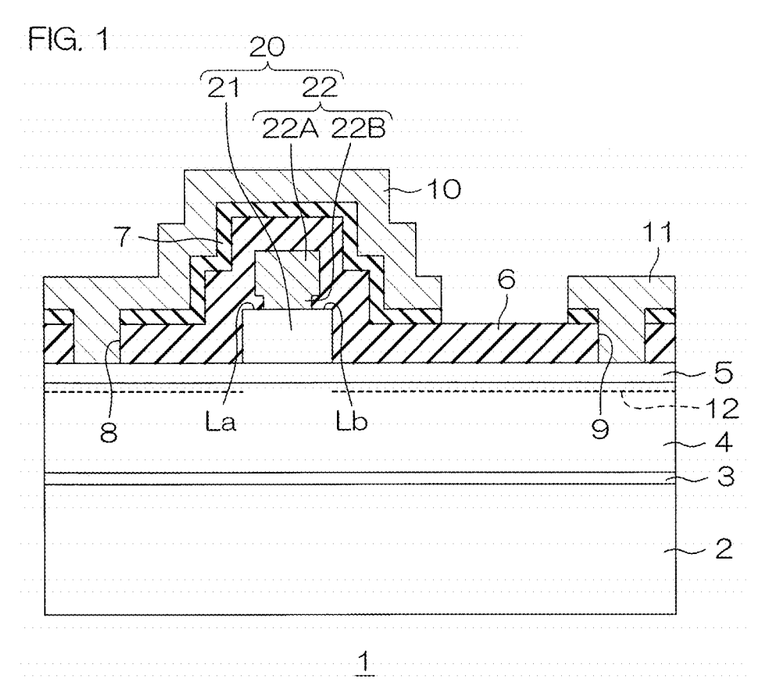
FIG. 1 is a sectional view for describing the arrangement of a nitride semiconductor device according to a preferred embodiment of the present invention.
Figure 2A:
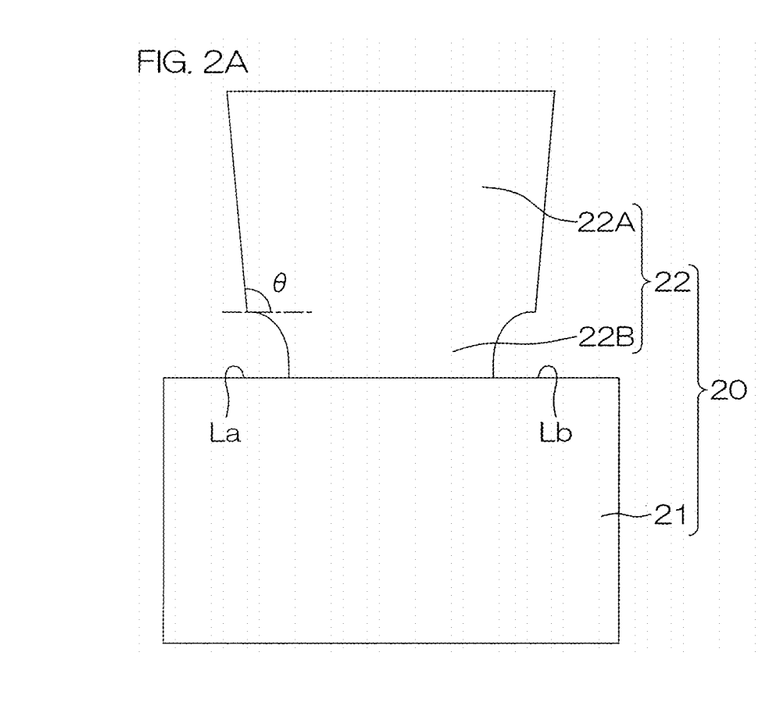
FIG. 2A is a partially enlarged sectional view mainly of a gate electrode and FIG. 2B is a partially enlarged sectional view of a modification example of the gate electrode and is a partially enlarged sectional view corresponding to FIG. 2A.

FIG. 1 is a sectional view for describing the arrangement of a nitride semiconductor device according to a preferred embodiment of the present invention. FIG. 2A is a partially enlarged sectional view mainly of a gate electrode.

The nitride semiconductor device 1 includes a substrate 2, a buffer layer 3 that is formed on a front surface of the substrate 2, a first nitride semiconductor layer 4 that is epitaxially grown on the buffer layer 3, a second nitride semiconductor layer 5 that is epitaxially grown on the first nitride semiconductor layer 4, and a gate portion 20 that is formed on the second nitride semiconductor layer 5.

Further, the nitride semiconductor device 1 includes a passivation film 6 that covers the second nitride semiconductor layer 5 and the gate portion 20 and a barrier metal film 7 that is formed on the passivation film 6. Further, the nitride semiconductor device 1 includes a source electrode 10 and a drain electrode 11 that penetrate through a source contact hole 8 and a drain contact hole 9 formed in a laminated film of the passivation film 6 and the barrier metal film 7 and are in contact with the second nitride semiconductor layer 5. The source electrode 10 and the drain electrode 11 are disposed at an interval. The source electrode 10 is formed such as to cover the gate portion 20.

The substrate 2 may, for example, be a silicon substrate of low resistance. The silicon substrate of low resistance may be a p type substrate having an electric resistivity of, for example, 0.001 Ωmm to 0.5 Ωmm (more specifically, approximately 0.01 Ωmm to 0.1 Ωmm). Also, besides a silicon substrate of low resistance, the substrate 2 may instead be an SiC substrate of low resistance, a GaN substrate of low resistance, etc. The substrate 2 has a thickness, for example, of approximately 650 μm during a semiconductor process and is ground to not more than approximately 300 μm in a preliminary stage before being made into a chip. The substrate 2 is electrically connected to the source electrode 10.

In this preferred embodiment, the buffer layer 3 is constituted of a multilayer buffer layer in which a plurality of nitride semiconductor films are laminated. In this preferred embodiment, the buffer layer 3 is constituted of a first buffer layer (not shown) constituted of an AlN film in contact with the front surface of the substrate 2 and a second buffer layer (not shown) constituted of an AlN/AlGaN superlattice layer laminated on a front surface of the first buffer layer (front surface at an opposite side to a substrate 2 side). A film thickness of the first buffer layer is approximately 100 nm to 500 nm. A film thickness of the second buffer layer is approximately 500 nm to 2 μm. The buffer layer 3 may instead be constituted, for example, of a single film or a composite film of AlGaN or of an AlGaN/GaN superlattice film.

The first nitride semiconductor layer 4 constitutes an electron transit layer. In this preferred embodiment, the first nitride semiconductor layer 4 is constituted of a GaN layer and a thickness thereof is approximately 0.5 μm to 2 μm. Also, an impurity by which a region other than a front surface region is made semi-insulating may be introduced for a purpose of suppressing a leak current that flows via the first nitride semiconductor layer 4. In this case, a concentration of the impurity is preferably not less than $4 \times 10^{16}$ cm$^{-3}$. Also, the impurity is, for example, C or Fe.

The second nitride semiconductor layer 5 constitutes an electron supply layer. The second nitride semiconductor layer 5 is constituted of a nitride semiconductor with a larger bandgap than the first nitride semiconductor layer 4. Specifically, the second nitride semiconductor layer 5 is constituted of a nitride semiconductor with a higher Al composition than the first nitride semiconductor layer 4. In a nitride semiconductor, the higher the Al composition, the larger the bandgap. In this preferred embodiment, the second nitride semiconductor layer 5 is constituted of an Al$_x$Ga$_{1-x}$N layer (0<x≤1). The composition of Al is preferably 10% to 30% and more preferably 10% to 15%. A thickness of the second nitride semiconductor layer 5 is preferably 5 nm to 25 nm and more preferably 15 nm to 25 nm.

The first nitride semiconductor layer (electron transit layer) 4 and the second nitride semiconductor layer (electron supply layer) 5 are thus constituted of nitride semiconductors that differ in bandgap (Al composition) and a lattice mismatch occurs therebetween. Also, due to spontaneous polarizations of the first nitride semiconductor layer 4 and the second nitride semiconductor layer 5 and a piezo polarization due to the lattice mismatch between the two, an energy level of a conduction band of the first nitride semiconductor layer 4 at an interface between the first nitride semiconductor layer 4 and the second nitride semiconductor layer 5 is made lower than a Fermi level. Thereby, inside the first nitride semiconductor layer 4, a two-dimensional electron gas (2DEG) 12 spreads at a position close to the interface between the first nitride semiconductor layer 4 and the second nitride semiconductor layer 5 (for example, at a distance of only several Å from the interface).

The gate portion 20 includes a nitride semiconductor gate layer (hereinafter referred to as the "semiconductor gate layer 21") of a ridge shape that is epitaxially grown on the second nitride semiconductor layer 5 and a gate electrode 22 that is formed on the semiconductor gate layer 21. Between the source contact hole 8 and the drain contact hole 9, the gate portion 20 is disposed biasedly toward the source contact hole 8.

The semiconductor gate layer 21 is constituted of a nitride semiconductor that is doped with an acceptor type impurity. More specifically, the semiconductor gate layer 21 is constituted of an Al$_y$Ga$_{1-y}$N (0≤y<1, y<x) layer that is doped with the acceptor type impurity. In this preferred embodiment, the semiconductor gate layer 21 is constituted of a GaN layer (p type GaN layer) that is doped with the acceptor type impurity. In this preferred embodiment, a lateral cross section of the semiconductor gate layer 21 has a rectangular shape.

The semiconductor gate layer 21 is provided to change a conduction band of an interface formed by the first nitride semiconductor layer 4 (electron transit layer) and the second nitride semiconductor layer 5 (electron supply layer) in a region directly below the gate portion 20 such that the two-dimensional electron gas 12 is not formed in the region directly below the gate portion 20 in a state in which a gate voltage is not applied.

In this preferred embodiment, the acceptor type impurity is Mg (magnesium). The acceptor type impurity may instead be Zn (zinc) or other acceptor type impurity besides Mg.

A film thickness of the semiconductor gate layer 21 is preferably greater than 100 nm and is more preferably not less than 110 nm. More preferably, the film thickness of the semiconductor gate layer 21 is not less than 110 nm and not more than 150 nm. The reason for these is that a maximum rated gate voltage in a positive direction can thereby be increased. In this preferred embodiment, the film thickness of the semiconductor gate layer 21 is approximately 110 nm.

In a sectional view in a ridge width direction, the gate electrode 22 is constituted of a first portion (upper portion) 22A of rectangular shape and a second portion (lower portion) 22B of rectangular shape that projects downward from a width intermediate portion of a lower surface of the first portion 22A. A width of the first portion 22A is narrower than a width of the semiconductor gate layer 21. In plan view, both side edges of the first portion 22A are receded further inward than corresponding side edges of the semiconductor gate layer 21.

A width of the second portion 22B is narrower than the width of the first portion 22A. In plan view, both side edges of the second portion 22B are receded further inward than the corresponding side edges of the first portion 22A. The second portion 22B is formed on a width intermediate portion of an upper surface of the semiconductor gate layer 21. In plan view, both side edges of the second portion 22B are receded further inward than the corresponding side edges of the semiconductor gate layer 21.

A film thickness of the gate electrode 22 is approximately 100 nm to 200 nm. A thickness of the first portion 22A is thicker than a thickness of the second portion 22B. The thickness of the first portion 22A is approximately 110 nm to 190 nm. The thickness of the second portion 22B is approximately 10 nm to 90 nm. Both side surfaces of the first portion 22A are substantially perpendicular. In this preferred embodiment, both side surfaces of the first portion 22A are formed to inclined surfaces such that the width of the first portion 22A becomes narrower as the second portion 22B is approached as shown in FIG. 2A. Also, both side surfaces of the first portion 22A may instead be formed to inclined surfaces such that the width of the first portion 22A becomes wider as the second portion 22B is approached as shown in FIG. 2B.

Figure 2B:
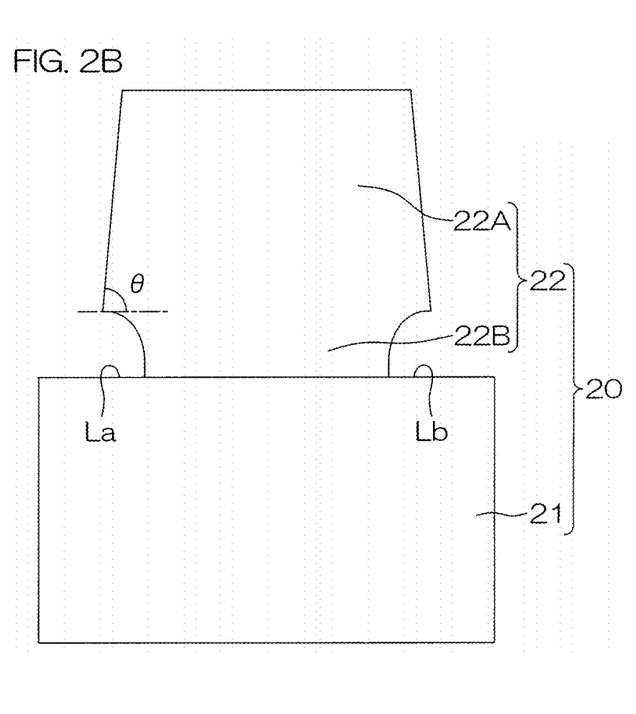

If inclination angles of both side surfaces of the first portion 22A with respect to a front surface of the semiconductor gate layer 21 when a width of the first portion 22A becomes narrower as the second portion 22B is approached as shown in FIG. 2A are expressed by angles θ of not less than 90 degrees (see FIG. 2A) and the inclination angles of both side surfaces of the first portion 22A with respect to the front surface of the semiconductor gate layer 21 when the width of the first portion 22A becomes wider as the second portion 22B is approached as shown in FIG. 2B are expressed by angles θ of not more than 90 degrees (see FIG. 2B), an average inclination angle θ of the respective side surfaces of the first portion 22A with respect to the front surface of the semiconductor gate layer 21 is preferably within a range of not less than 80 degrees and not more than 95 degrees.

The reason why the thickness of the first portion 22A is made thicker than the thickness of the second portion 22B is as follows. As shall be described below, etching for forming the first portion 22A is faster in etching rate in a vertical direction per unit time in comparison to etching for forming the second portion 22B. Both side surfaces of the first portion 22A are thus formed substantially perpendicularly.

Figure 3A:
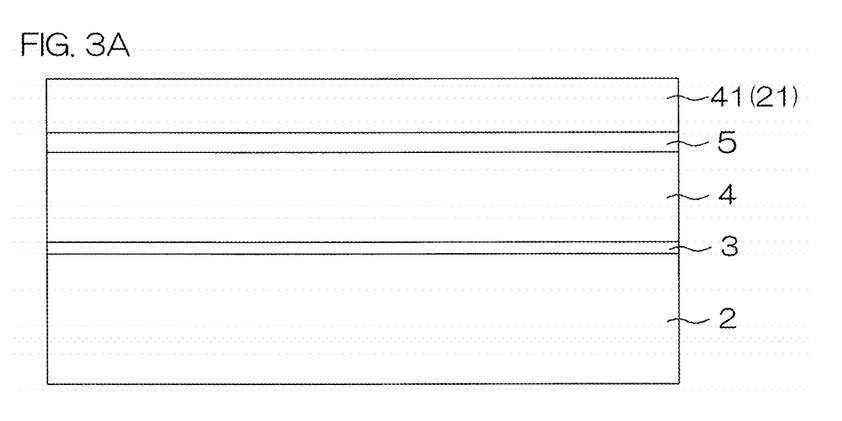
FIG. 3A is a sectional view of an example of a manufacturing process of the nitride semiconductor device of FIG. 1.
Figure 3B:
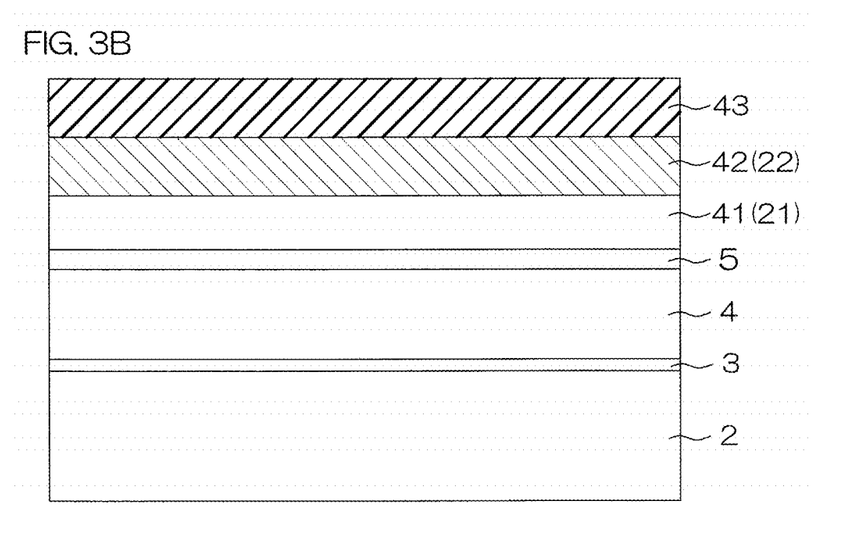
FIG. 3B is a sectional view of a step subsequent to that of FIG. 3A.
Figure 3C:
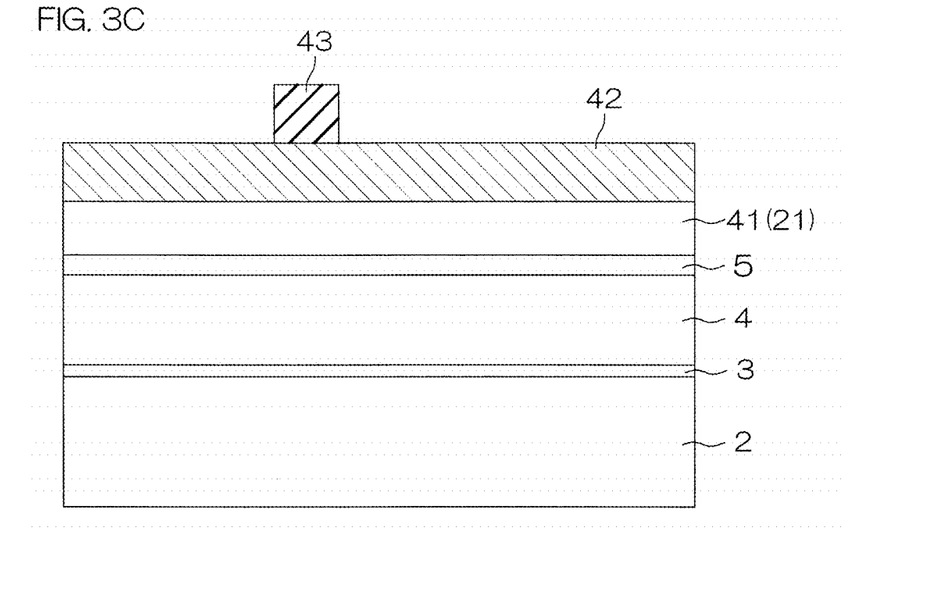
FIG. 3C is a sectional view of a step subsequent to that of FIG. 3B.
Figure 3D:
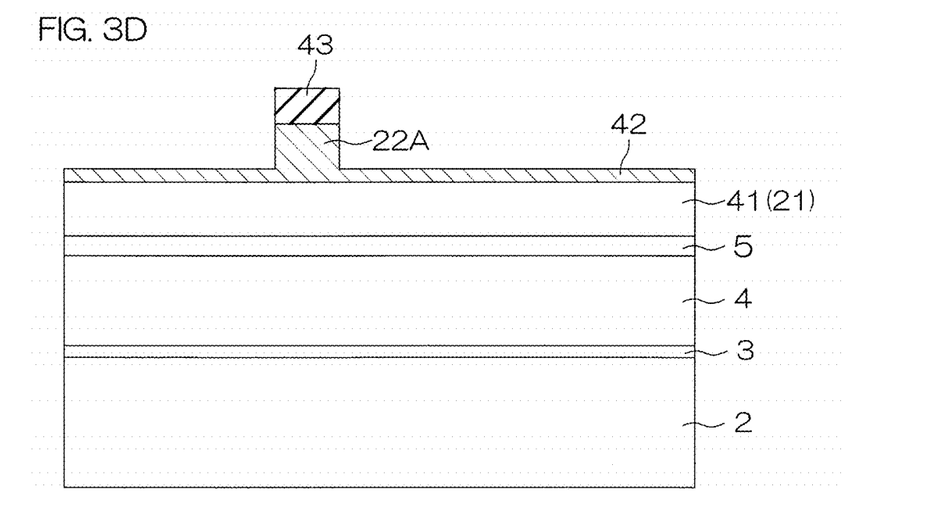
FIG. 3D is a sectional view of a step subsequent to that of FIG. 3C.
Figure 3E:
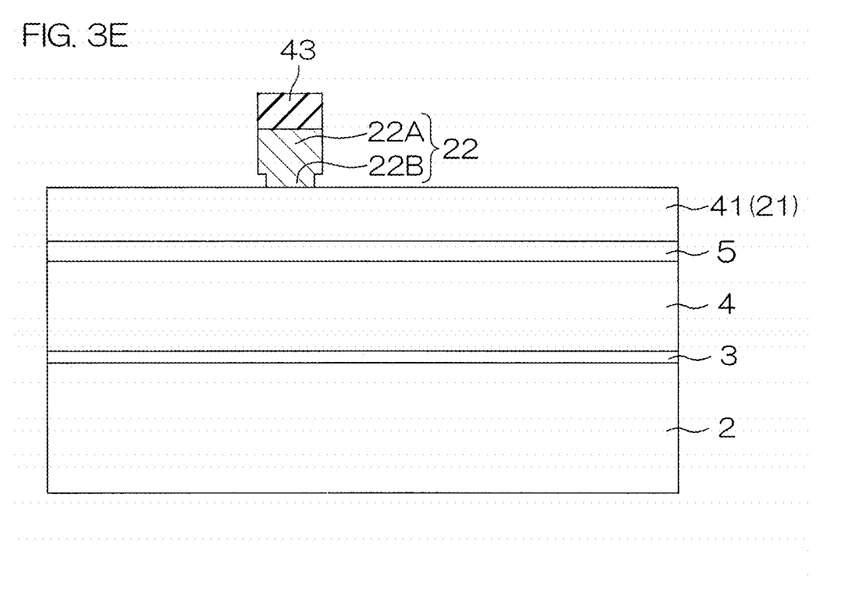
FIG. 3E is a sectional view of a step subsequent to that of FIG. 3D.
Figure 3F:
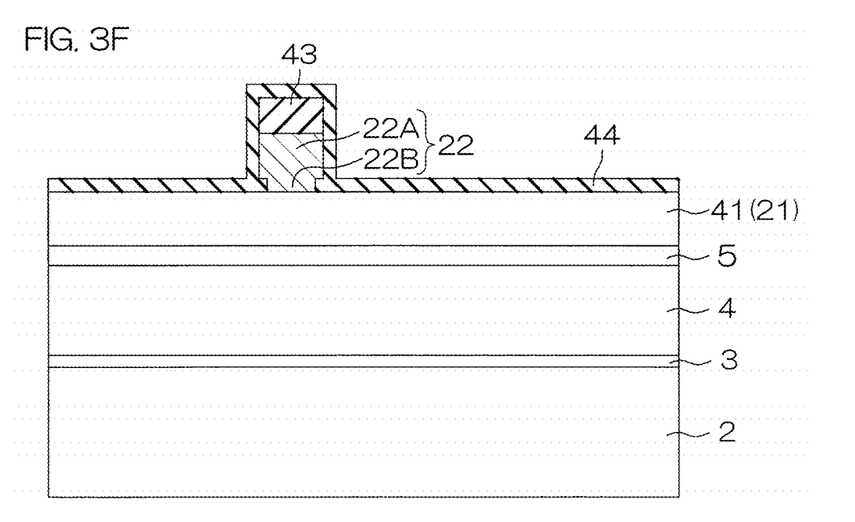
FIG. 3F is a sectional view of a step subsequent to that of FIG. 3E.
Figure 3G:
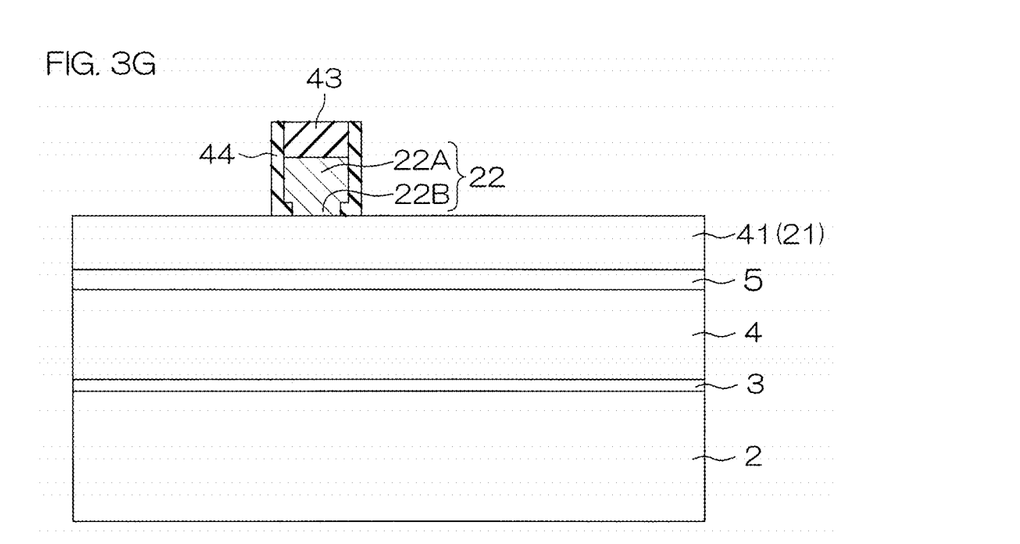
FIG. 3G is a sectional view of a step subsequent to that of FIG. 3F.

In a manufacturing process of the nitride semiconductor device 1, side walls (an SiO$_2$ film 44) that become a portion of a mask for forming the semiconductor gate layer 21 are formed at both side surfaces of the gate electrode 22 (see FIG. 3F and FIG. 3G). In this process, if the film thickness of the first portion 22A with which both side surfaces are high in perpendicularity is thinner than that of the second portion 22B with which both side surfaces are low in perpendicularity, it is difficult to form the side walls appropriately at both side surfaces of the gate electrode 22. With the present preferred embodiment, the film thickness of the first portion 22A with which both side surfaces are high in perpendicularity is thicker than that of the second portion 22B with which both side surfaces are low in perpendicularity and therefore, the side walls can be formed appropriately at both side surfaces of the gate electrode 22. Consequently, the semiconductor gate layer 21 can be formed to an appropriate shape.

A region between one side edge of the gate electrode 22 (second portion 22B) on the semiconductor gate layer 21 upper surface and a corresponding side edge of the semiconductor gate layer 21 shall be referred to as a first ledge La. Also, a region between the other side edge of the gate electrode 22 (second portion 22B) on the semiconductor gate layer 21 upper surface and a corresponding side edge of the semiconductor gate layer 21 shall be referred to as a second ledge Lb. When such ledges La and Lb are provided, distances between lower edges at both sides of the gate electrode 22 (second portion 22B) and upper edges of the corresponding side edges of the semiconductor gate layer 21 are increased in comparison to a case where the ledges are not provided and therefore, a gate leak current that flows from the gate electrode 22 to the source electrode 10 via the front surface and side surfaces of the semiconductor gate layer 21 can be reduced.

In this preferred embodiment, the gate electrode 22 is in Schottky contact with the upper surface of the semiconductor gate layer 21. The gate electrode 22 is constituted of TiN. The gate electrode 22 may be constituted of a single film that is any one of a Ti film, a TiN film, and a TiW film or of a composite film constituted of any combination of two or more of the films.

The passivation film 6 covers a front surface of the second nitride semiconductor layer 5 (with the exception of regions facing the contact holes 8 and 9) and side surfaces and a front surface of the gate portion 20. That is, an exposed surface of the second nitride semiconductor layer 5 front surface, the side surfaces and an exposed front surface of the semiconductor gate layer 21, and the side surfaces and the front surface of the gate electrode 22 are covered by the same passivation film 6. A film thickness of the passivation film 6 is approximately 50 nm to 200 nm. In this preferred embodiment, the passivation film 6 is constituted of an SiN film. The passivation film 6 may instead be constituted of a single film that is any one of an SiN film, an $SiO_2$ film, an SiON film, an $AL_2O_3$ film, an AlN film, and an AlON film or of a composite film constituted of any combination of two or more of the films.

The barrier metal film 7 is formed selectively on the passivation film 6. In this preferred embodiment, the barrier metal film 7 is constituted of a TiN film and a thickness thereof is approximately 50 nm. The barrier metal film 7 is provided to prevent a metal material constituting the source electrode 10 and the drain electrode 11 from diffusing into the passivation film 6.

The source electrode 10 and the drain electrode 11 are constituted, for example, of first metal layers (ohmic metal layers) that are in contact with the second nitride semiconductor layer 5, second metal layers (main electrode metal layers) that are laminated on the first metal layers, third metal layers (adhesion layers) that are laminated on the second metal layers, and fourth metal layers (barrier metal layers) that are laminated on the third metal layers. The first metal layers are, for example, Ti layers with thicknesses of approximately 10 nm to 20 nm. The second metal layers are, for example, AlCu layers with thicknesses of approximately 100 nm to 300 nm. The third metal layers are, for example, Ti layers with thicknesses of approximately 10 nm to 20 nm. The fourth metal layers are, for example, TiN layers with thicknesses of approximately 10 nm to 50 nm.

With the nitride semiconductor device 1, a heterojunction is formed by there being formed on the first nitride semiconductor layer 4 (electron transit layer), the second nitride semiconductor layer 5 (electron supply layer) that differs in bandgap (Al composition). The two-dimensional electron gas 12 is thereby formed inside the first nitride semiconductor layer 4 near the interface between the first nitride semiconductor layer 4 and the second nitride semiconductor layer 5, and an HEMT making use of the two-dimensional electron gas 12 as a channel is formed. The gate electrode 22 opposes the second nitride semiconductor layer 5 across the semiconductor gate layer 21.

Below the gate electrode 22, energy levels of the first nitride semiconductor layer 4 and the second nitride semiconductor layer 5 are pulled up by ionized acceptors contained in the semiconductor gate layer 21 that is constituted of the p type GaN layer. The energy level of the conduction band at the heterojunction interface between the first nitride semiconductor layer 4 and the second nitride semiconductor layer 5 is thus made higher than the Fermi level. Therefore, the two-dimensional electron gas 12 formed by the spontaneous polarizations of the first nitride semiconductor layer 4 and the second nitride semiconductor layer 5 and the piezo polarization due to the lattice mismatch of the two layers is not formed directly below the gate electrode 22 (gate portion 20).

Therefore, when a bias is not applied to the gate electrode 22 (zero bias state), the channel due to the two-dimensional electron gas 12 is interrupted directly below the gate electrode 22. A normally-off type HEMT is thus realized. When an appropriate on voltage (for example, of 5 V) is applied to the gate electrode 22, a channel is induced inside the first nitride semiconductor layer 4 directly below the gate electrode 22 and the two-dimensional electron gas 12 at both sides of the gate electrode 22 becomes connected. The source and the drain are thereby made continuous to each other.

For use, for example, a predetermined voltage (for example, of 50 V to 100 V) with which the drain electrode 11 side becomes positive is applied between the source electrode 10 and the drain electrode 11. In this state, an off voltage (0 V) or the on voltage (5 V) is applied to the gate electrode 22 with the source electrode 10 being at a reference potential (0 V).

FIG. 3A to FIG. 3M are sectional views for describing an example of a manufacturing process of the nitride semiconductor device 1 described above and show a cross-sectional structure at a plurality of stages in the manufacturing process.

First, as shown in FIG. 3A, the buffer layer 3, the first nitride semiconductor layer (electron transit layer) 4, and the second nitride semiconductor layer (electron supply layer) 5 are epitaxially grown on the substrate 2 by an MOCVD (metal organic chemical vapor deposition) method. Further, a gate layer material film 41 that is a material film of the semiconductor gate layer 21 is epitaxially grown on the second nitride semiconductor layer 5 by the MOCVD method.

Next, as shown in FIG. 3B, a gate electrode film 42 that is a material film of the gate electrode 22 is formed, for example, by a sputtering method such as to cover an entire front surface that is exposed. An SiN film 43 is then formed on the gate electrode film 42, for example, by a plasma CVD (chemical vapor deposition) method.

Next, as shown in FIG. 3C, for example, by dry etching, the SiN film 43 is selectively removed while leaving the SiN film 43 on a gate electrode preparation planned region of the gate electrode film 42 front surface.

Next, as shown in FIG. 3D, the first portion 22A of the gate electrode 22 is formed by dry etching the gate electrode film 42 using the SiN film 43 as a mask. This etching step shall be referred to as the first etching step.

Next, as shown in FIG. 3E, the second portion 22B of the gate electrode 22 is formed by dry etching the gate electrode film 42 using the SiN film 43 and the first portion 22A as masks. This etching step shall be referred to as the second etching step.

The gate electrode 22 is thereby formed. That is, the step of forming the gate electrode 22 is constituted of the first etching step of forming the first portion 22A from an upper end to a thickness direction intermediate portion of the gate electrode 22 and the second etching step for forming the remaining second portion 22B of the gate electrode 22.

An etching rate per unit time in the vertical direction (perpendicular direction) of the second etching step is slower than an etching rate per unit time in the vertical direction of the first etching step. That is, the etching in the second etching step is lower in perpendicularity in comparison to the etching in the first etching step. On the other hand, a lateral direction amount that is etched in the second etching step is preferably greater than a lateral direction amount that is etched in the first etching step.

Such differences in etching characteristics are achieved by changing the etching conditions of the first etching step and the second etching step. For example, an etching power (biasing high frequency power) of the second etching step may be made lower than an etching power of the first etching step. Also, an etching gas flow rate of the second etching step may be made less than an etching gas flow rate of the first etching step. Also, the second etching step and the first etching step may be differed in type of etching gas. Also, the first etching step and the second etching step may be differed in combination of any two or more of the etching power, the etching gas flow rate, and the type of etching gas.

Also, a substrate temperature in the second etching step may be set higher than a substrate temperature in the first etching step to adjust amounts of etching products and make a finely finished shape.

Next, as shown in FIG. 3F, an $SiO_2$ film 44 is formed, for example, by a plasma CVD method such as to cover entire surfaces that are exposed.

Next, as shown in FIG. 3G, for example, by dry etching, the $SiO_2$ film 44 is etched back such as to form the $SiO_2$ film 44 (side walls) that covers the side surfaces of the gate electrode 22 and the SiN film 43.

Figure 3H:
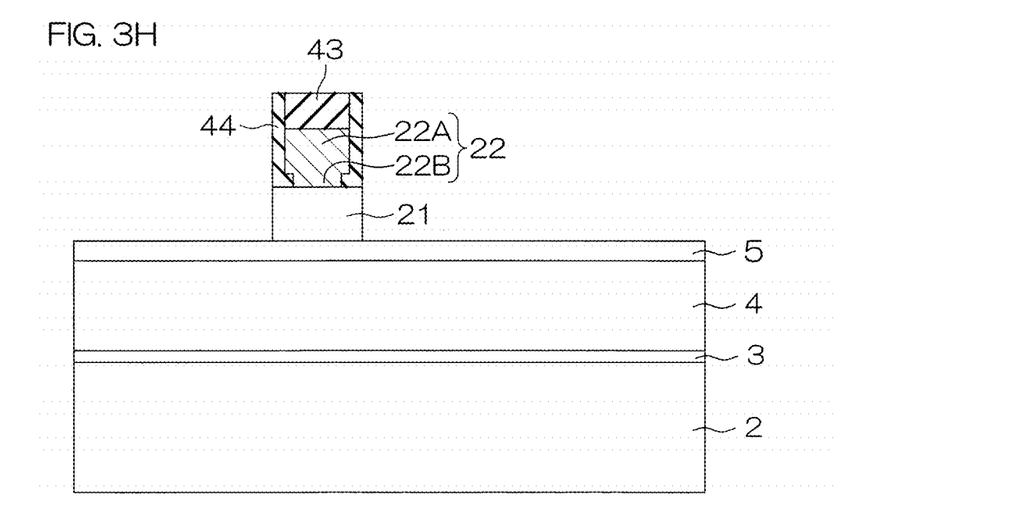
FIG. 3H is a sectional view of a step subsequent to that of FIG. 3G.

Next, as shown in FIG. 3H, the gate layer material film 41 is patterned by dry etching using the SiN film 43 and the $SiO_2$ film 44 as masks. The semiconductor gate layer 21 of the ridge shape is thereby obtained.

Figure 3I:
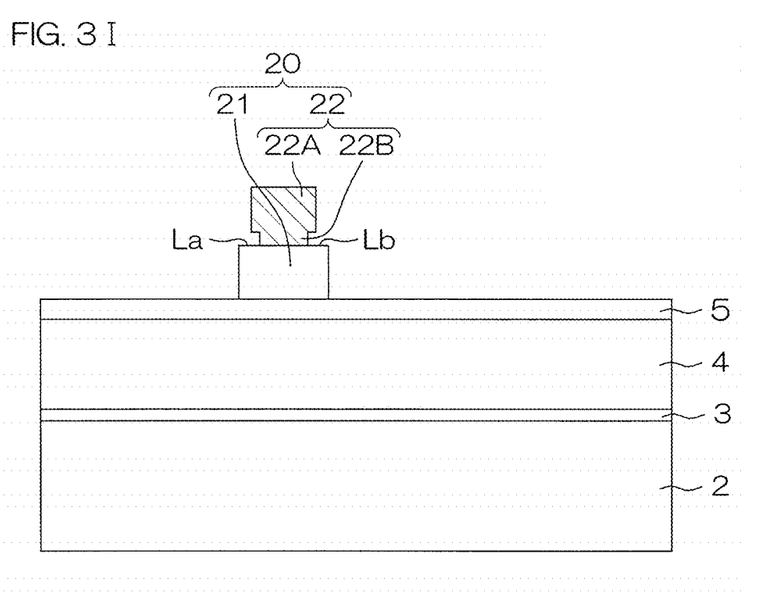
FIG. 3I is a sectional view of a step subsequent to that of FIG. 3H.

Next, as shown in FIG. 3I, the SiN film 43 and the $SiO_2$ film 44 are removed by wet etching. The gate portion 20 that is constituted of the semiconductor gate layer 21 of the ridge shape and the gate electrode 22 formed on the width intermediate portion of the upper surface of the semiconductor gate layer 21 is thereby formed.

Figure 3J:
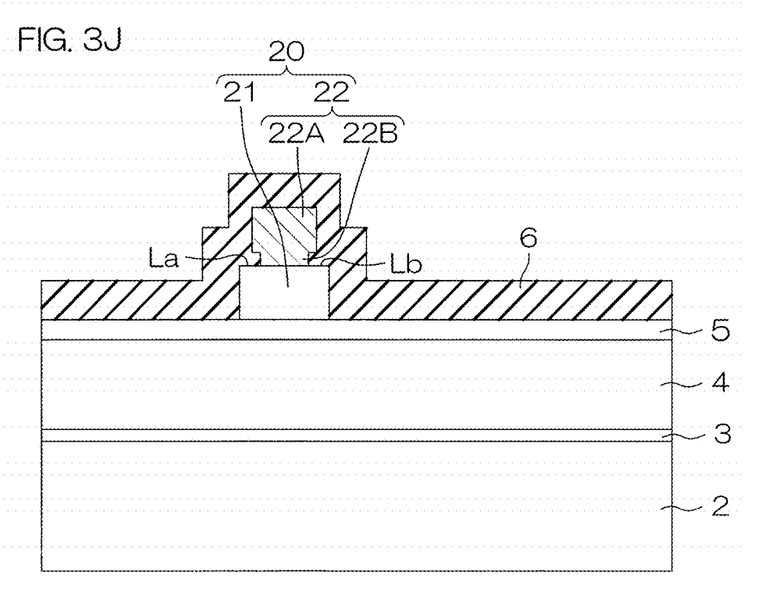
FIG. 3J is a sectional view of a step subsequent to that of FIG. 3I.

Next, as shown in FIG. 3J, the passivation film 6 is formed such as to cover entire surfaces that are exposed. The passivation film 6 is constituted, for example, of SiN.

Figure 3K:
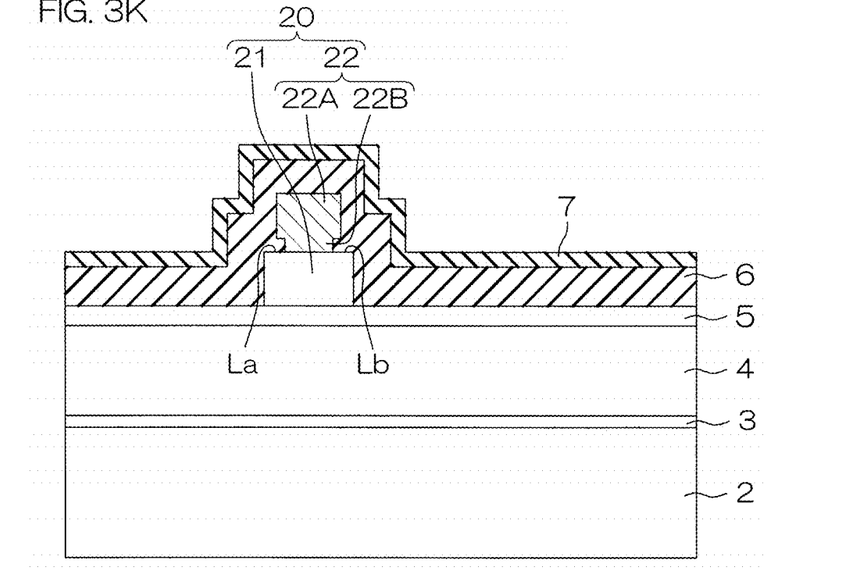
FIG. 3K is a sectional view of a step subsequent to that of FIG. 3J.

Next, as shown in FIG. 3K, the barrier metal film 7 is formed on the front surface of the passivation film 6. The barrier metal film 7 is constituted, for example, of TiN.

Figure 3L:
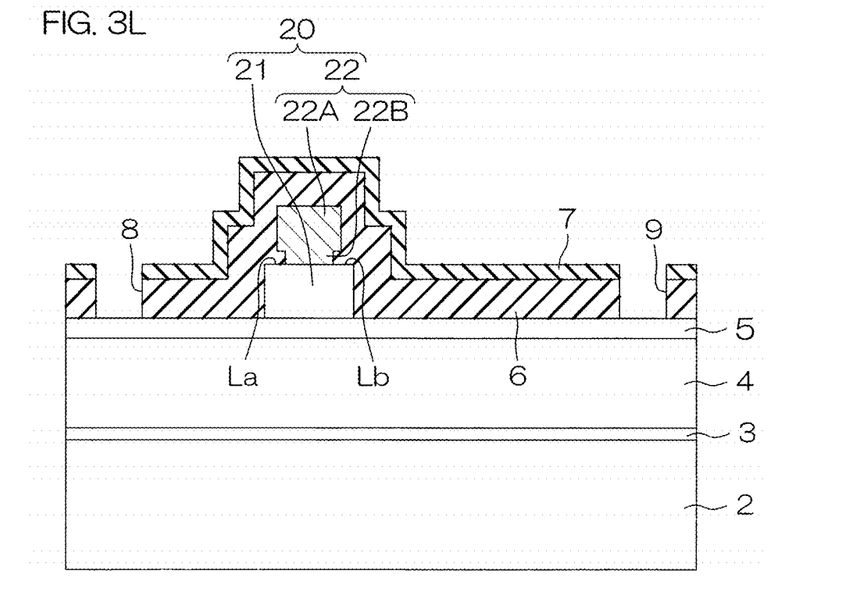
FIG. 3L is a sectional view of a step subsequent to that of FIG. 3K.

Next, as shown in FIG. 3L, the source contact hole 8 and the drain contact hole 9 that reach the second nitride semiconductor layer 5 are formed in the laminated film of the passivation film 6 and the barrier metal film 7.

Figure 3M:
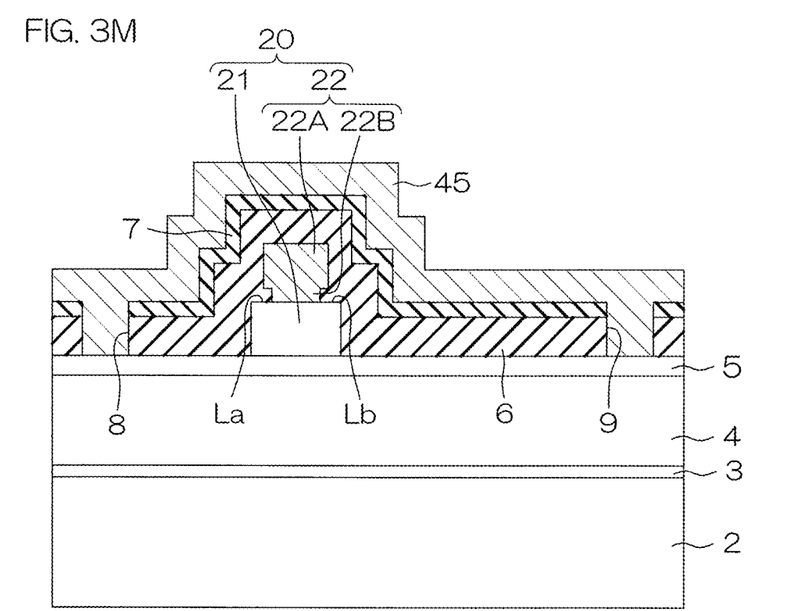
FIG. 3M is a sectional view of a step subsequent to that of FIG. 3L.

Next, as shown in FIG. 3M, a source/drain electrode film 45 is formed such as to cover entire surfaces that are exposed.

Lastly, the source/drain electrode film 45 and the barrier metal film 7 are patterned by photolithography and etching to form the source electrode 10 and the drain electrode 11 that are in contact with the second nitride semiconductor layer 5. The nitride semiconductor device 1 with the structure such as shown in FIG. 1 is thereby obtained.

With the above-described method for manufacturing the nitride semiconductor device 1, the step of forming the gate electrode 22 includes the first etching step for forming the first portion 22A from the upper end to the thickness direction intermediate portion of the gate electrode 22 and the second etching step for forming the remaining second portion 22B of the gate electrode 22. In the second etching step, etching that is slower in the etching rate in the vertical direction per unit time in comparison to the first etching step is performed. That is, etching that prioritizes perpendicularity is performed in the first etching step and etching that prioritizes low damage is performed in the second etching step.

Etching damage applied to the front surface of the semiconductor gate layer 21 can thus be reduced in comparison to a case of forming the entire gate electrode 22 by the first etching step. The front surface of the semiconductor gate layer 21 can thereby be suppressed from changing to an n type due to desorption of nitrogen therefrom and therefore, the front surface of the semiconductor gate layer 21 can be made high in resistance. The gate leak current that flows from the gate electrode 22 to the source electrode 10 via the front surfaces and the side surfaces of the semiconductor gate layer 21 and the second nitride semiconductor layer (electron supply layer) 5 can thereby be reduced.

With the above-described method for manufacturing the nitride semiconductor device 1, the first portion 22A is formed by the etching that prioritizes perpendicularity and therefore both side surfaces of the first portion 22A can be made substantially perpendicular. An insulating object that becomes a portion of a mask during the etching of the semiconductor gate layer 21 can thereby be formed appropriately at both sides of the gate electrode. Consequently, the semiconductor gate layer 21 can be formed to an appropriate shape.

Although a preferred embodiment of the present invention has been described above, the present invention can be implemented in yet other preferred embodiments.

For example, although in the preferred embodiment described above, the second portion 22B is formed in the second etching step (see FIG. 3E) by dry etching, the second portion 22B may be formed by wet etching instead.

Also, although in the preferred embodiment described above, the side walls constituted of the $SiO_2$ film 44 are formed on both side surfaces of the gate electrode 22 by the steps illustrated in FIG. 3F and FIG. 3G, in place of these steps, a mask that covers the entire gate electrode 22 may be formed using a resist.

Also, Si may be contained in the second nitride semiconductor layer directly below the source electrode and the drain electrode.

Also, although with the preferred embodiment described above, silicon was taken up as an example of the material of the substrate 2, any substrate material besides this, such as a sapphire substrate, a QST substrate, etc., may be applied.

While preferred embodiments of the present invention were described in detail above, these are merely specific examples used to clarify the technical contents of the present invention and the present invention should not be interpreted as being limited to these specific examples and the scope of the present invention is limited only by the appended claims.

The present application corresponds to Japanese Patent Application No. 2020-010249 filed on Jan. 24, 2020 in the Japan Patent Office, and the entire disclosure of this application is incorporated herein by reference.

REFERENCE SIGNS LIST 1 nitride semiconductor device
2 substrate
3 buffer layer
4 first nitride semiconductor layer
5 second nitride semiconductor layer
6 passivation film
7 barrier metal film
8 source contact hole
9 drain contact hole
10 source electrode
11 drain electrode
12 two-dimensional electron gas (2DEG)
20 gate portion
21 nitride semiconductor gate layer
22 gate electrode
22A first portion
22B second portion
41 gate layer material film
42 gate electrode film
43 SiN film
44 SiO$_2$ film
45 source/drain electrode film

The invention claimed is:

1. A method for manufacturing nitride semiconductor device comprising:
  a first step of forming a first nitride semiconductor layer that constitutes an electron transit layer, a second nitride semiconductor layer that constitutes an electron supply layer, and a gate layer material film that is a material film of a nitride semiconductor gate layer containing an acceptor type impurity in that order above a substrate;
  a second step of forming, on the gate layer material film, a gate electrode film that is a material film of a gate electrode;
  a third step of selectively etching the gate electrode film to form the gate electrode of a ridge shape;
  a fourth step of selectively etching the gate layer material film to form the semiconductor gate layer of a ridge shape with the gate electrode disposed at a width intermediate portion of a front surface thereof; and
  a fifth step of forming a passivation film such as to cover an exposed front surface of the second nitride semiconductor layer, side surfaces and an exposed front surface of the nitride semiconductor gate layer, and side surfaces of the gate electrode; and
  wherein the third step includes a first etching step for forming a first portion from an upper end to a thickness direction intermediate portion of the gate electrode and a second etching step being a step differing in etching condition from the first etching step and being for forming a remaining second portion of the gate electrode and
  the exposed front surface of the second nitride semiconductor layer, the side surfaces and the exposed front surface of the nitride semiconductor gate layer, and the side surfaces of the gate electrode are covered by the same passivation film.

2. The method for manufacturing nitride semiconductor device according to claim 1, wherein a thickness of the gate electrode film removed by the first etching step is greater than a thickness of the gate electrode film removed by the second etching step.

3. The method for manufacturing nitride semiconductor device according to claim 1, wherein if inclination angles of both side surfaces of the first portion with respect to the front surface of the semiconductor gate layer when a width of the first portion becomes narrower as the second portion is approached are expressed by angles of not less than 90 degrees and inclination angles of both side surfaces of the first portion with respect to the front surface of the semiconductor gate layer when the width of the first portion becomes wider as the second portion is approached are expressed by angles of not more than 90 degrees, an average inclination angle of the respective side surfaces of the first portion with respect to the front surface of the semiconductor gate layer is within a range of not less than 80 degrees and not more than 95 degrees.

4. The method for manufacturing nitride semiconductor device according to any claim 1, wherein an etching rate in a vertical direction per unit time of the second etching step is slower than an etching rate in the vertical direction per unit time of the first etching step.

5. The method for manufacturing nitride semiconductor device according to claim 1, wherein a lateral direction amount that is etched in the second etching step is greater than a lateral direction amount that is etched in the first etching step.

6. The method for manufacturing nitride semiconductor device according to claim 1, wherein the second etching step is dry etching.

7. The method for manufacturing nitride semiconductor device according to claim 1, wherein the second etching step is wet etching.

8. The method for manufacturing nitride semiconductor device according to claim 6, wherein the first etching step is dry etching.

9. The method for manufacturing nitride semiconductor device according to claim 1, further comprising: a step between the third step and the fourth step of forming a first insulating film on the gate layer material film such as to cover the gate electrode and thereafter etching back the first insulating film to form side walls that cover the side surfaces of the gate electrode.

10. The method for manufacturing nitride semiconductor device according to claim 9, further comprising: a step between the second step and the third step of forming a second insulating film on a front surface of the gate electrode film layer and thereafter selectively etching the second insulating film to form a mask on the front surface of the gate electrode film layer; and wherein in the third step, the gate electrode film is etched using the mask.

11. The method for manufacturing nitride semiconductor device according to claim 9, further comprising: a step between the fourth step and the fifth step of removing the side walls.

12. The method for manufacturing nitride semiconductor device according to claim 10, further comprising: a step between the fourth step and the fifth step of removing the mask and the side walls.

13. The method for manufacturing nitride semiconductor device according to claim 1, further comprising after the fifth step:
a step of forming a barrier metal on the passivation film;
a step of forming a source contact hole and a drain contact hole that penetrate through the barrier metal and the passivation film at positions opposing each other across the semiconductor gate layer;
a step of forming, on the barrier metal, a source/drain electrode film that covers at least the source contact hole and the drain contact hole; and
a step of selectively etching the source/drain electrode film and the barrier metal to form a source electrode and a drain electrode are further included after the fifth step.

14. A nitride semiconductor device comprising:
a substrate;
a first nitride semiconductor layer that is formed above the substrate and constitutes an electron transit layer;
a second nitride semiconductor layer that is formed on the first nitride semiconductor layer, is greater in bandgap than the first nitride semiconductor layer, and constitutes an electron supply layer;
a semiconductor gate layer of ridge shape that is formed on the second nitride semiconductor layer and contains an acceptor type impurity;
a gate electrode of ridge shape that is formed on a width intermediate portion of a front surface of the semiconductor gate layer;
a passivation film that is formed such as to cover an exposed surface of a front surface of the second nitride semiconductor layer and side surfaces and a front surface of the gate electrode; and
a source electrode and a drain electrode that are disposed on the second nitride semiconductor layer to oppose each other across the semiconductor gate layer; and
wherein the gate electrode, in a sectional view in a ridge width direction, is constituted of a first portion of rectangular shape and a second portion that projects downward from a width intermediate portion of a lower surface of the first portion, and
the exposed surface of the front surface of the second nitride semiconductor layer and the side surfaces and the front surface of the gate electrode are covered by the same passivation film.

15. The nitride semiconductor device according to claim 14, wherein if inclination angles of both side surfaces of the first portion with respect to the front surface of the semiconductor gate layer when a width of the first portion becomes narrower as the second portion is approached are expressed by angles of not less than 90 degrees and inclination angles of both side surfaces of the first portion with respect to the front surface of the semiconductor gate layer when the width of the first portion becomes wider as the second portion is approached are expressed by angles of not more than 90 degrees, an average inclination angle of the respective side surfaces of the first portion with respect to the front surface of the semiconductor gate layer is within a range of not less than 80 degrees and not more than 95 degrees.

16. The nitride semiconductor device according to claim 14, wherein
the first nitride semiconductor layer is constituted of a GaN layer,
the second nitride semiconductor layer is constituted of an $Al_xGa_{1-x}N$ ($0<x\leq1$) layer, and
the semiconductor gate layer is constituted of a p type GaN layer.

17. The nitride semiconductor device according to claim 14, wherein the acceptor impurity is Mg or Zn.

18. The nitride semiconductor device according to claim 14, wherein the gate electrode is in Schottky contact with the semiconductor gate layer.

* * * * *